United States Patent
Kang (10) Patent No.: US 9,859,495 B2
(45) Date of Patent: Jan. 2, 2018

(54) MASK ASSEMBLY, APPARATUS FOR MANUFACTURING DISPLAY APPARATUS, AND METHOD OF MANUFACTURING DISPLAY APPARATUS

(71) Applicant: Samsung Display Co., Ltd., Yongin-si (KR)

(72) Inventor: Seongjong Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 15/092,241

(22) Filed: Apr. 6, 2016

(65) Prior Publication Data

US 2017/0056911 A1 Mar. 2, 2017

(30) Foreign Application Priority Data

Aug. 31, 2015 (KR) .................. 10-2015-0123201

(51) Int. Cl.
| | | |
|---|---|---|
| *H01L 21/00* | (2006.01) | |
| *H01L 51/00* | (2006.01) | |
| *B05C 21/00* | (2006.01) | |
| *C23C 14/04* | (2006.01) | |
| *H01L 27/32* | (2006.01) | |

(52) U.S. Cl.
CPC ........ *H01L 51/0011* (2013.01); *B05C 21/005* (2013.01); *C23C 14/042* (2013.01); *H01L 27/3244* (2013.01)

(58) Field of Classification Search
CPC ........... B05B 15/04; B05B 9/00; H01L 51/00; H01L 51/56; H01L 27/32

USPC .......................................... 438/34
See application file for complete search history.

(56) References Cited

U.S. PATENT DOCUMENTS

| | | | |
|---|---|---|---|
| 2008/0118743 A1* | 5/2008 | Lee ........... | C23C 14/042 428/332 |
| 2009/0127236 A1* | 5/2009 | Hong ........... | G03F 7/12 219/121.64 |
| 2012/0167822 A1 | 7/2012 | Lee | |
| 2012/0234235 A1* | 9/2012 | Lee ........... | C23C 14/042 118/504 |
| 2012/0234236 A1* | 9/2012 | Ko ........... | C23C 14/042 118/504 |
| 2012/0299024 A1 | 11/2012 | Lee et al. | |
| 2013/0318774 A1* | 12/2013 | Kang ........... | B05C 21/005 29/592 |
| 2014/0115874 A1* | 5/2014 | Narita ........... | B41F 15/0881 29/593 |
| 2014/0326780 A1* | 11/2014 | Han ........... | B23K 31/02 228/103 |

(Continued)

FOREIGN PATENT DOCUMENTS

| | | |
|---|---|---|
| JP | 2008-108596 | 5/2008 |
| KR | 10-2012-0079725 | 7/2012 |

(Continued)

*Primary Examiner* — Caleb Henry
(74) *Attorney, Agent, or Firm* — H.C. Park & Associates, PLC (57) ABSTRACT

A mask assembly and an apparatus and method of manufacturing a display apparatus. The mask assembly includes a mask frame, a plurality of mask sheets arranged on the mask frame, and a support frame arranged on the mask frame and having a portion that contacts and supports the mask sheets.

17 Claims, 4 Drawing Sheets

(56) References Cited

U.S. PATENT DOCUMENTS

2015/0246416 A1* 9/2015 Mizumura ............ C23C 14/042
　　　　　　　　　　　　　　　　　　　　156/272.8
2016/0001542 A1* 1/2016 Saito .................... C23C 14/042
　　　　　　　　　　　　　　　　　　　　156/73.5

FOREIGN PATENT DOCUMENTS

KR　10-2013-0062571　　6/2013
KR　10-2013-0111181　　10/2013
KR　10-2012-0131544　　12/2015

* cited by examiner

MASK ASSEMBLY, APPARATUS FOR MANUFACTURING DISPLAY APPARATUS, AND METHOD OF MANUFACTURING DISPLAY APPARATUS

CROSS-REFERENCE TO RELATED PATENT APPLICATION

This application claims priority from and the benefit of Korean Patent Application No. 10-2015-0123201, filed on Aug. 31, 2015, which is hereby incorporated by reference for all purposes as if fully set forth herein.

BACKGROUND

Field

Exemplary embodiments of the present invention relate to a mask assembly, an apparatus for manufacturing a display apparatus, and a method of manufacturing the display apparatus.

Discussion of the Background

Electronic mobile devices have come into widespread use. For example, tablet PCs, in addition to small-sized electronic devices such as mobile phones, have been widely used.

In order to support various functions, a mobile electronic device includes a display unit for providing a user with visual information such as images or videos. Recently, as the components for driving such a display unit have become miniaturized, an area occupied by the display unit in the electronic device has gradually increased. Moreover, a structure that may be curved to a predetermined angle from a flat state has been developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a mask assembly and an apparatus for and a method of manufacturing a display apparatus.

Additional features of the invention will be set forth in the description which follows, and in part will be apparent from the description, or may be learned by practice of the invention.

An exemplary embodiment of the present invention discloses a mask assembly including a mask frame; a plurality of mask sheets arranged on the mask frame; and a support frame arranged on the mask frame and having a portion that contacts and supports the mask sheets.

An exemplary embodiment of the present invention also discloses an apparatus for manufacturing a display apparatus including a mask assembly facing a first substrate; a support supporting the mask assembly; and a deposition source facing the mask assembly and configured to spray a deposition material onto the first substrate. The mask assembly includes a mask frame; a plurality of mask sheets arranged on the mask frame; and a support frame arranged on the mask frame and having a portion that contacts and supports the mask sheets.

An exemplary embodiment of the present invention also discloses a method of manufacturing a display apparatus including inserting a first substrate and a mask assembly into a chamber; spraying a deposition material into a deposition source; and passing the deposition material through the mask assembly and depositing the deposition material on the first substrate. The mask assembly includes a mask frame; a plurality of mask sheets arranged on the mask frame; and a support frame arranged on the mask frame and having a portion that contacts and supports the mask sheets.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
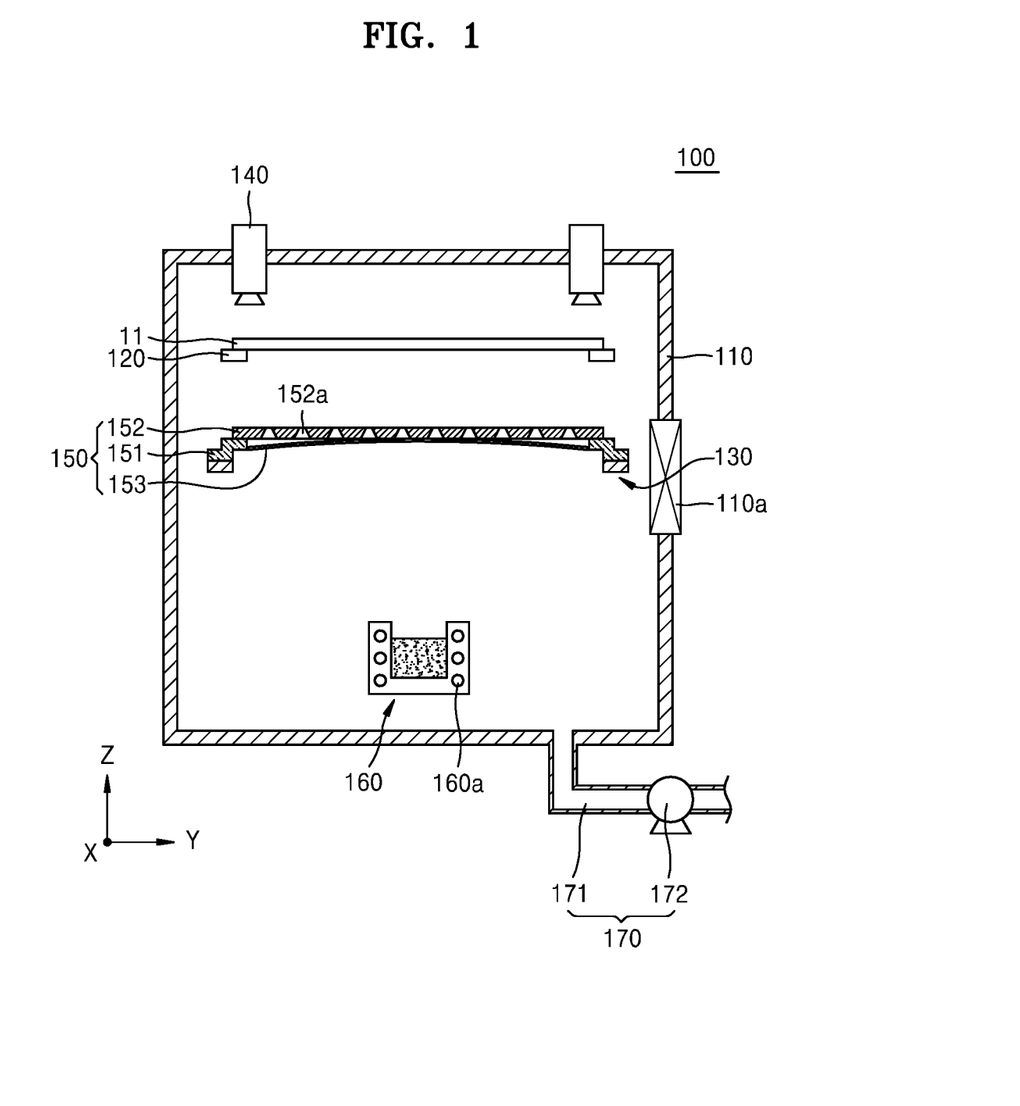
FIG. 1 is a conceptual view of an apparatus for manufacturing a display apparatus, according to an exemplary embodiment of the present invention.

FIG. 1 is a conceptual view of an apparatus 100 for manufacturing a display apparatus, according to an exemplary embodiment of the present invention.

Referring to FIG. 1, the apparatus 100 may include a chamber 110, a substrate support 120, a support 130, a vision unit 140, a mask assembly 150, a deposition source 160, and a pressure adjuster 170.

The chamber 110 may include an aperture formed on one side thereof. A gate valve 110a or the like may be provided in the aperture and, thus, may open or close the aperture.

The substrate support 120 may be formed to have various shapes. According to an exemplary embodiment, the substrate support 120 may be formed to have a shuttle shape. In this case, the substrate support 120 may be transferred from the outside of the chamber 110 into the chamber 110. According to another exemplary embodiment, the substrate support 120 may be formed to have the shape of a frame to be fixed in the chamber 110. According to another exemplary embodiment, the substrate support 120 may be formed to have the shape of an electrostatic chuck provided in the chamber 110. However, the substrate support 120 is not limited thereto, and examples of the substrate support 120 may include any device and structure that may support a first substrate 11 or fix the first substrate 11 in the chamber 110. However, for convenience of description, a case where the substrate support 120 is formed to have the shape of a frame to be fixed in the chamber 110 will now be described in detail.

The mask assembly 150 may be safely seated on the support 130. After the mask assembly 150 is safely seated on the support 130, the support 130 may move the mask assembly 150. For example, the support 130 may include an alignment unit (not shown) which moves the mask assembly 150 in three different directions.

The vision unit 140 may be provided in the chamber 110. The vision unit 140 may be a camera for photographing at least one of the first substrate 11 and the mask assembly 150.

The mask assembly 150 may include a mask frame 151, a mask sheet 152, and a support frame 153. The mask assembly 150 will be described later in more detail.

The deposition source 160 may be disposed to face the mask assembly 150. The deposition source 160 may be disposed at various locations according to types of deposition material. For example, the deposition source 160 may be disposed in an upper or lower portion of the chamber 110. Alternatively, the deposition source 160 may be disposed on a lateral side of the chamber 110. However, for convenience of description, a case where the deposition source 160 is disposed in the lower portion of the chamber 110 will now be described in detail.

The deposition source 160 may have an accommodating space in which a deposition material is accommodated. The deposition source 160 may include a heater 160a, which heats the deposition material. The deposition source 160 may sublimate or vaporize the deposition material by heating the deposition material. Such a vaporized deposition material may be deposited on the first substrate 11 via the mask assembly 150.

Examples of the deposition material may include various materials. For example, the deposition material may be a metal. According to another exemplary embodiment, the deposition material may include an organic material. For convenience of description, a case where the deposition material is an organic material will now be described in detail. In addition, for convenience of description, a case where the organic material is deposited on a substrate and forms an intermediate layer (not shown) will now be described in detail.

The pressure adjuster 170 may include a connection pipe 171 connected to the chamber 110, and a pump 172 provided on the connection pipe 171. According to an operation of the pump 172, an internal pressure of the chamber 110 may be controlled. For example, the pump 172 may maintain the chamber at a nearly vacuum state while deposition is being performed. When the first substrate 11 and the mask assembly 150 enter the chamber 110, the pump 172 is able to adjust the internal pressure of the chamber 110 to be equal to the atmospheric pressure.

When the pump 172 maintains the internal pressure of the chamber 110 to be at an atmospheric pressure level, the gate valve 110a may be open. At this time, the first substrate 11 and the mask assembly 150 may be inserted into the chamber 110. In this case, a robot arm or a shuttle (not shown) may be disposed within the chamber 110 and to move the first substrate 11 and the mask assembly 150 into the chamber 110. For convenience of explanation, a case where a robot arm is disposed outside the chamber 110 to move the first substrate 11 and the mask assembly 150 into the chamber 110 will now be described in detail.

The robot arm may insert the first substrate 11 into the chamber 110 and then safely seat the first substrate 11 on the substrate support 120. After the robot arm inserts the mask assembly 150 into the chamber 110, the robot arm may safely seat the mask assembly 150 on the support 130.

After the first substrate 11 and the mask assembly 150 are safely seated, the vision unit 140 may photograph the first substrate 11 and the mask assembly 150. At this time, both of the first substrate 11 and the mask assembly 150 may already have alignment marks formed therein.

An image captured by the vision unit 140 may be transmitted to a controller (not shown). The controller may determine whether the first substrate 11 and the mask assembly 150 are positioned at preset locations. The controller may also determine whether the first substrate 11 and the mask assembly 150 have been accurately aligned. The controller may be formed in various forms, such as external terminals, for example, an electronic circuit, and a computer.

When the controller determines that the first substrate 11 and the mask assembly 150 are not aligned, the controller may operate the support 130 to adjust the location of the mask assembly 150.

On the other hand, when the controller determines that the first substrate 11 and the mask assembly 150 are aligned, the controller may operate the deposition source 160 to deposit the deposition material on the first substrate 11. At this time, the pump 172 may maintain the internal pressure of the chamber 110 in a nearly vacuum state.

When the deposition of the deposition material on the first substrate 11 is completed, the pump 172 may maintain the internal pressure of the chamber 110 at an atmospheric pressure level. When the gate valve 110a operates to open the chamber 110, the robot arm removes the first substrate 11 from the chamber 110.

While such an operation is being conducted, the mask assembly 150 may be deformed by the deposition material emitted from the deposition source 160. In this connection, a structure and an operation of the mask assembly 150 will now be described in detail.

Figure 2:
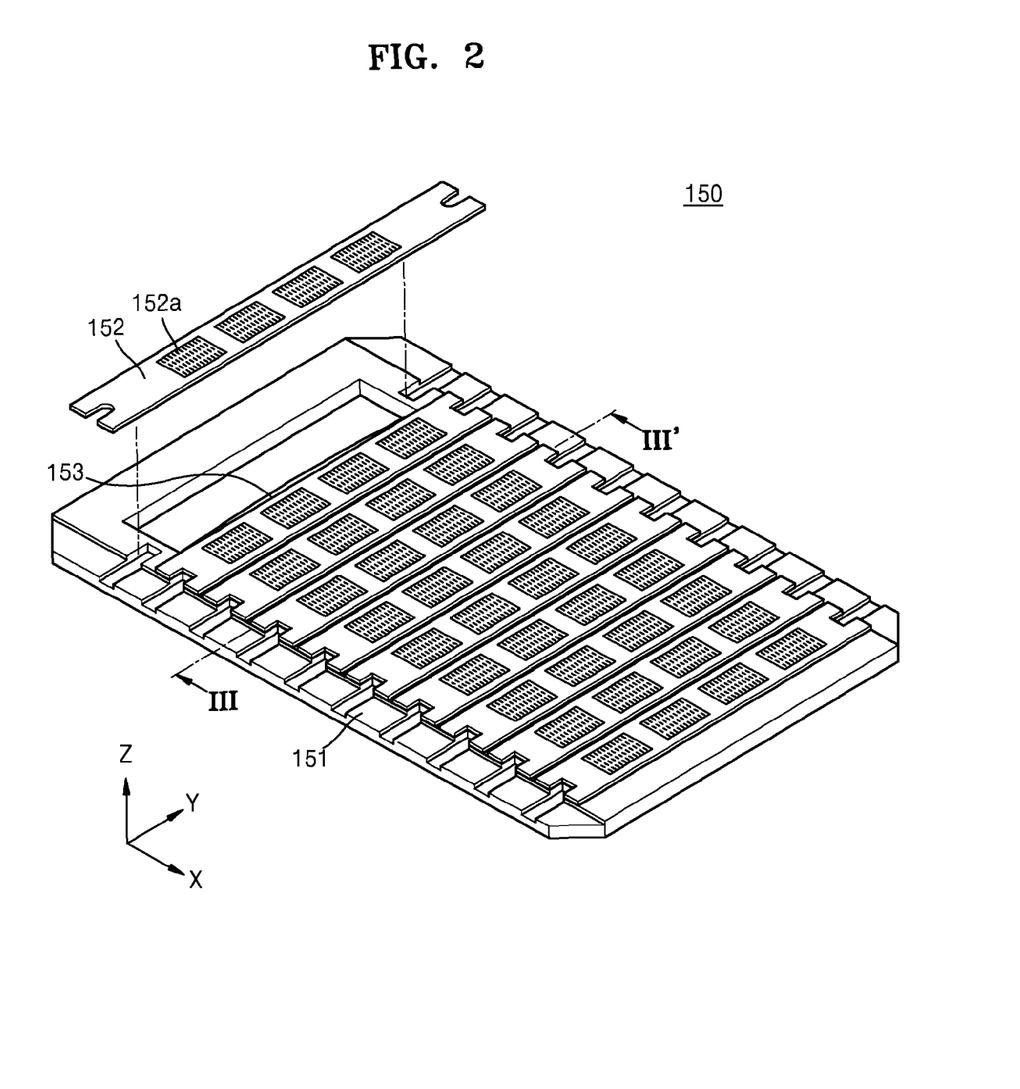
FIG. 2 is a perspective view of a mask assembly included in the apparatus illustrated in FIG. 1.
Figure 3:
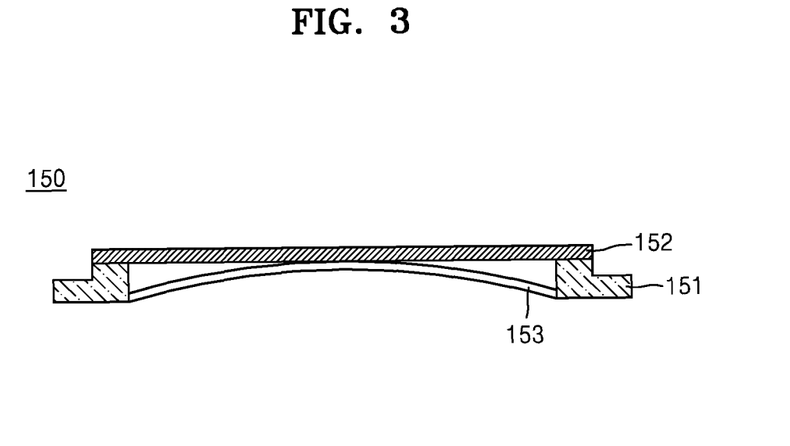
FIG. 3 is a cross-sectional view taken along line of FIG. 2.
Figure 4:
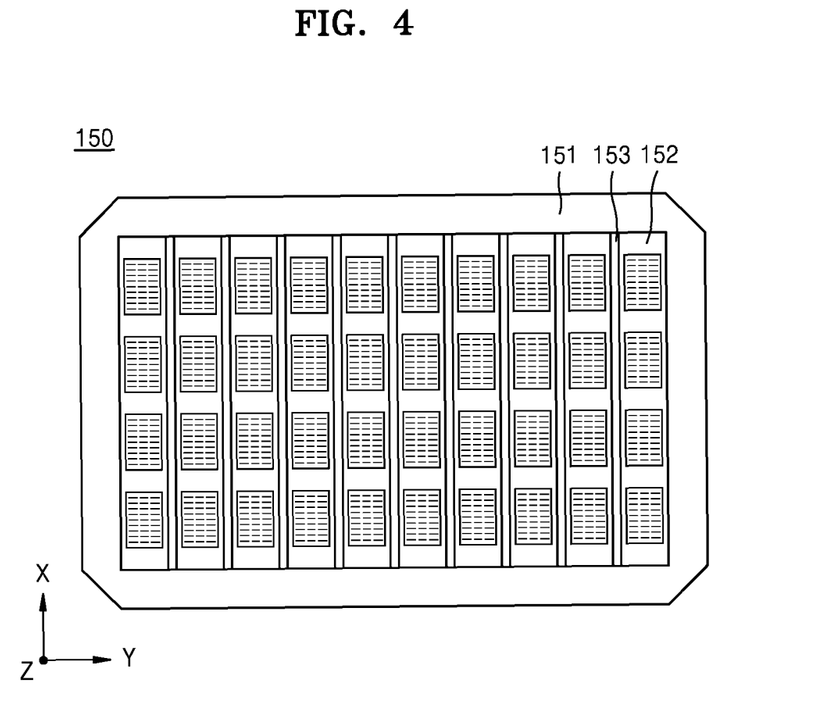
FIG. 4 shows a bottom surface of the mask assembly illustrated in FIG. 2.

FIG. 2 is a perspective view of the mask assembly 150 illustrated in FIG. 1. FIG. 3 is a cross-sectional view taken along line of FIG. 2. FIG. 4 shows a bottom surface of the mask assembly 150 illustrated in FIG. 2.

Referring to FIGS. 2-4, the mask assembly 150 may include a mask frame 151, a mask sheet 152, and a support frame 153.

The mask frame 151 may be formed to have an opening in a center portion thereof.

The mask sheet 152 may have an elongated shape. The mask sheet 152 may have apertures 155a forming a pattern, so that the deposition material passes through the apertures 152a. In particular, a plurality of apertures 155a may be formed within a single area to respectively correspond to each of cells of the first substrate 11 or each of light-emission regions (not shown) of the first substrate 11.

A plurality of mask sheets 152 may be included, and may be arranged adjacent to each other. Adjacent mask sheets 152 may be spaced apart from each other.

The mask sheets 152 may each extend on the mask frame 151. Both ends of each of the mask sheets 152 may be gripped by a separate clamp (not shown) or the like, and then may be stretched in a length direction of the mask sheets 152. In this state, the mask sheets 152 may be disposed on the mask frame 151 and then fixed onto the mask frame 151 via welding or the like. After the mask sheets 152 are fixed onto the mask frame 151, both ends of each of the mask sheets 152 may be partially cut out.

The mask sheets 152 may directly contact the mask frame 151. According to another exemplary embodiment, a reinforcing member (not shown) may be interposed between the mask sheets 152 and the mask frame 151 by providing the reinforcing member on the mask frame 151 and providing the mask sheets 152 on the reinforcing member. According to another exemplary embodiment, a blocking mask (not shown) may be used instead of the reinforcing member. The blocking mask may have a lattice shape. For convenience of description, a case where the mask sheets 152 directly contact the mask frame 151 will now be described in detail.

The support frame 153 may be fixed to both ends of the mask frame 151. A portion of the support frame 153 may contact the mask sheets 152. In detail, the portion of the support frame 153 that contacts the mask sheets 152 is curved upward to be higher than the other portions thereof. The portion of the support frame 153 that contacts the mask sheets 152 may correspond to portions of the mask sheets 152 that may sag the most as a result of the weight of the mask sheets 152. For example, because a center portion of the support frame 153 is higher than the other portions thereof, the center portion of the support frame 153 may contact center portions of the mask sheets 152.

The support frame 153 may be arranged in the length direction of the mask sheets 152. The support frame 153 may have a curved shape. In other words, the support frame 153 may be formed in an arch shape.

A plurality of support frames 153 may be included, and may be spaced apart from one another. Each of the support frames 153 may be disposed between adjacent mask sheets 152 and shield a space between the adjacent mask sheets 152. In particular, the support frames 153 may support lateral surfaces of each of the mask sheets 152.

The support frames 153 may be formed of a material having a different thermal expansion coefficient than that of the mask sheets 152. In detail, the thermal expansion coefficient of the support frames 153 may be greater than that of the mask sheets 152. For example, the mask sheets 152 may be formed of a material in which a thermal expansion coefficient is in a range of 0.8 cm/° C.$\times 10^{-6}$ to 1.2 cm/° C.$\times 10^{-6}$ when a temperature is between 30° C. and 300° C. The support frames 153 may be formed of a material of which a thermal expansion coefficient is in a range of 4.0 cm/° C.$\times 10^{-6}$ to 4.7 cm/° C.$\times 10^{-6}$ when a temperature is between 30° C. and 300° C.

The mask assembly 150 may be exposed to heat when the deposition material is deposited. In detail, when the deposition material is sprayed via the deposition source 160, as described above with reference to FIG. 1, a heated deposition material may pass through the mask assembly 150. At this time, the mask sheets 152 may be deformed by the heat of the deposition material, and center portions of the mask sheets 152 may sag due to the weight of the mask sheets 152. The deposition material may also heat the support frames 153. At this time, the lengths of the support frames 153 may also be deformed by the deposition material.

When the mask sheets 152 and the support frames 153 are deformed as described above, the support frames 153 may be deformed to a greater extent than the mask sheets 152 because the thermal expansion coefficient of the support frames 153 is greater than that of the mask sheets 152. In other words, the thermal expansion coefficient of the support frames 153 may be increased to be greater than that of the mask sheets 152.

When the support frames 153 are deformed as described above, the highest portions of the support frame 153 (or center portions of the support frames 153) may further rise toward the mask sheets 152. In particular, because both ends of each of the support frames 153 have been fixed to the mask sheets 152, the support frames 153 may apply a force to the mask sheets 152 as a result of the deformation of the support frames 153 by heat. At this time, the portions of the mask sheets 152 that sag as a result of heat deformation of the mask sheets 152 may be supported by the support frames 153.

Thus, the mask assembly 150 and the apparatus 100 may prevent the mask sheets 152 from sagging as a result of deformation of the mask sheets 152 by heat. Moreover, the mask assembly 150 and the apparatus 100 may minimize deformation of the mask sheets 152 and, thus, enable the deposition material to be deposited in a precise pattern on the first substrate 11.

Figure 5:
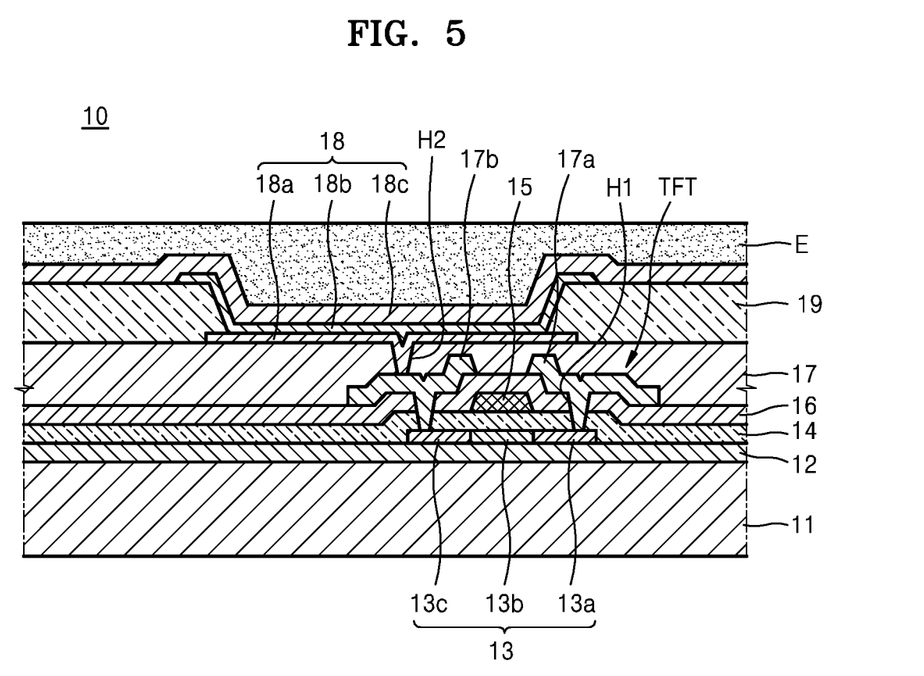
FIG. 5 is a cross-sectional view of a portion of a display apparatus manufactured by the apparatus illustrated in FIG. 1.

FIG. 5 is a cross-sectional view of a portion of a display apparatus 10 manufactured by the apparatus 100 of FIG. 1.

Referring to FIG. 5, the apparatus 100 may form an intermediate layer 18*b*. Thereafter, an opposite electrode 18*c* may be formed on the intermediate layer 18*b*, and then a thin-film encapsulation layer E or a second substrate (not shown) may be provided on the opposite electrode 18*c*. In this way, the display apparatus 10 may be manufactured.

In detail, the display apparatus 10 may include a first substrate 11 and a light-emission unit (not shown). The display apparatus 10 may also include the thin-film encapsulation layer E or the second substrate (not shown) formed on an upper surface of the light-emission unit. The second substrate may be the same as, or similar to, a second substrate used in a general display apparatus and, thus, a detailed description thereof will be omitted herein. In addition, for convenience of description, a case where the display apparatus 10 includes the thin-film encapsulation layer E will now be described in detail.

The light-emission unit may include a thin film transistor TFT, a passivation layer 17 covering the thin film transistor TFT, and an organic light-emitting diode (OLED) 18 formed on the passivation layer 17.

The first substrate 11 may be formed of a glass material, but exemplary embodiments of the invention are not limited thereto. The first substrate 11 may be formed of a plastic material or a metal material, such as, steel use stainless (SUS) or titanium (Ti). Alternatively, the first substrate 11 may use polyimide (PI). For convenience of description, a case where the first substrate 11 is formed of a glass material will now be described in detail.

A buffer layer 12 formed of an organic compound and/or an inorganic compound is further formed on an upper surface of the first substrate 11. The buffer layer 12 may be formed of silicon oxide ($SiO_x$) ($x \geq 1$) or silicon nitride ($SiN_x$) ($x \geq 1$).

An active layer 13 arranged in a predetermined pattern is formed on the buffer layer 12 and is then buried by a gate insulating layer 14. The active layer 13 includes a source region 13*a* and a drain region 13*c*, and further includes a channel region 13*b* therebetween.

The active layer 13 may be formed to include various materials. For example, the active layer 13 may include an inorganic semiconductor material, such as amorphous silicon or crystalline silicon. As another example, the active layer 13 may include an oxide semiconductor. As another example, the active layer 13 may include an organic semiconductor material. However, for convenience of description, a case where the active layer 13 is formed of amorphous silicon will now be described in detail.

The active layer 13 may be formed by forming an amorphous silicon layer on the buffer layer 12, crystallizing the amorphous silicon layer to form a polycrystalline silicon layer, and patterning the polycrystalline silicon layer. The source region 13*a* and the drain region 13*b* of the active layer 13 are doped with impurities according to a TFT type, such as a driving TFT (not shown), a switching TFT, or the like.

A gate electrode 15 facing the active layer 13, and an interlayer insulating layer 16 which buries the gate electrode 15 are formed on an upper surface of the gate insulating layer 14.

Contact holes H1 are formed in the interlayer insulating layer 16 and the gate insulating layer 14, and then a source electrode 17*a* and a drain electrode 17*b* are formed on the interlayer insulating layer 16 such that the source electrode 17*a* and the drain electrode 17*b* contact the source region 13*a* and the drain region 13*b*, respectively.

The passivation layer 17 is formed on the thin film transistor TFT formed as described above, and a pixel electrode 18*a* of the OLED 18 is formed on the passivation layer 17. The pixel electrode 18*a* contacts the drain electrode 17*b* of the thin-film transistor TFT through a via hole H2 formed in the passivation layer 17. The passivation layer 17 may be formed of an inorganic material and/or an organic material and as a single layer or multiple layers. The passivation layer 17 may be formed as a planarization layer such that an upper surface thereof is flat regardless of the unevenness of a lower layer under the passivation layer 17. Alternatively, the passivation layer 17 may be formed to be uneven according to the unevenness of the lower layer. The passivation layer 17 may be formed of a transparent insulator so that a resonance effect is achieved.

After forming the pixel electrode 18*a* on the passivation layer 17, the pixel-definition layer 19 is formed of an organic material and/or an inorganic material such that the pixel-definition layer 19 covers the pixel electrode 18*a* and the passivation layer 17. The pixel-definition layer 19 has an aperture which exposes the pixel electrode 18*a*.

The intermediate layer 18*b* and the opposite electrode 18*c* are formed on at least the pixel electrode 18*a*.

The pixel electrode 18*a* functions as an anode, and the opposite electrode 18*c* functions as a cathode. Alternatively, the pixel electrode 18*a* may function as a cathode, and the opposite electrode 18*c* may function as an anode.

The pixel electrode 18*a* and the opposite electrode 18*c* are insulated from each other by the intermediate layer 18*b*, and respectively apply voltages of opposite polarities to the intermediate layer 18*b* to induce light emission in an organic emission layer.

The intermediate layer 18*b* may include an organic emission layer. For example, the intermediate layer 18*b* includes an organic emission layer. However, the intermediate layer 18b may further include at least one of a hole injection layer (HIL), a hole transport layer (HTL), an electron transport layer (ETL), and an electron injection layer (EIL) as a common layer (not shown).

One unit pixel includes a plurality of sub-pixels, and the plurality of sub-pixels may emit light of various colors. For example, the unit pixel may include a plurality of sub-pixels which respectively emit red light, green light, and blue light, or a plurality of sub-pixels which respectively emit red light, green light, blue light, and white light.

The thin-film encapsulation layer E may include a plurality of inorganic layers (not shown), or an inorganic layer and an organic layer (not shown).

The organic layer of the thin-film encapsulation layer E is formed of a polymer and may be a single layer or a layer stack formed of polyethylene terephthalate (PET), PI, polycarbonate (PC), epoxy, polyethylene, or polyacrylate. The organic layer may be formed of polyacrylate. In detail, the organic layer may include a result of polymerizing a monomer composition including a diacrylate-based monomer and a triacrylate-based monomer. The monomer composition may further include monoacrylate-based monomer. The monomer composition may further include a well-known photoinitiator such as a 2,4,6-trimethyl benzoyl diphenyl phosphine oxide (TPO), but exemplary embodiments of the present invention are not limited thereto.

The inorganic layer of the thin-film encapsulation layer E may be a single layer or a layer stack including metal oxide or metal nitride. In detail, the inorganic layer may include $SiN_x$, $Al_2O_3$, $SiO_2$, or $TiO_2$.

An uppermost layer exposed to the outside in the thin-film encapsulation layer E may be formed of an inorganic layer to prevent infiltration of moisture to the OLED 18.

The thin-film encapsulation layer E may include at least one sandwich structure in which at least one organic layer is interposed between at least two inorganic layers. Alternatively, the thin-film encapsulation layer E may include at least one sandwich structure in which at least one inorganic layer is interposed between at least two organic layers. Alternatively, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may include a first inorganic layer, a first organic layer, and a second inorganic layer sequentially formed starting from an upper portion of the OLED 18.

Alternatively, the thin-film encapsulation layer E may include a first inorganic layer, a first organic layer, a second inorganic layer, a second organic layer, and a third inorganic layer sequentially formed starting from the upper portion of the OLED 18.

Alternatively, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 18.

A halogenated metal layer including lithium fluoride (LiF) may be further included between the OLED 18 and the first inorganic layer. The halogenated metal layer may prevent the OLED 18 from being damaged when the first inorganic layer is formed by sputtering.

The first organic layer may have an area smaller than the second inorganic layer, and the second organic layer may also have an area smaller than the third inorganic layer.

Thus, the display apparatus 10 is able to display high-quality images by including the intermediate layer 18b having a precise pattern.

In a mask assembly and an apparatus and method of manufacturing a display apparatus according to exemplary embodiments of the present invention, a deposition material may be deposited on a first substrate to have a precise pattern.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask assembly comprising:
    a mask frame;
    a plurality of mask sheets arranged on the mask frame; and
    a support frame arranged on the mask frame, the support frame having a portion that contacts a lower surface of the mask sheets and supports the mask sheets,
    wherein the support frame has a thermal expansion coefficient different from a thermal expansion coefficient of the mask sheets.

2. The mask assembly of claim 1, wherein the portion of the support frame that contacts the mask sheets is higher than end portions of the support frame.

3. The mask assembly of claim 1, wherein the support frame is arranged between adjacent mask sheets.

4. The mask assembly of claim 1, wherein a center portion of the support frame contacts center portions of the mask sheets and supports the mask sheets.

5. The mask assembly of claim 1, wherein the thermal expansion coefficient of the mask sheets is less than the thermal expansion coefficient of the support frame.

6. The mask assembly of claim 1, wherein the support frame has a curved shape.

7. An apparatus for manufacturing a display apparatus, the apparatus comprising:
    a mask assembly facing a first substrate;
    a support supporting the mask assembly; and
    a deposition source facing the mask assembly and configured to spray a deposition material onto the first substrate,
    wherein:
    the mask assembly comprises:
        a mask frame;
        a plurality of mask sheets arranged on the mask frame; and
        a support frame arranged on the mask frame, a portion of the support frame contacting a lower surface of the mask sheets and supporting the mask sheets; and
    the support frame has a thermal expansion coefficient different from a thermal expansion coefficient of the mask sheets.

8. The apparatus of claim 7, wherein the portion of the support frame that contacts the mask sheets is higher than end portions of the support frame.

9. The apparatus of claim 7, wherein the support frame is between adjacent mask sheets.

10. The apparatus of claim 7, wherein a center portion of the support frame contacts center portions of the mask sheets and supports the mask sheets.

11. The apparatus of claim 7, wherein the thermal expansion coefficient of the mask sheets is less than the thermal expansion coefficient of the support frame.

12. The apparatus of claim 7, wherein the support frame has a curved shape.

13. A method of manufacturing a display apparatus, the method comprising:
inserting a first substrate and a mask assembly into a chamber;
spraying a deposition material into a deposition source; and
passing the deposition material through the mask assembly and depositing the deposition material on the first substrate,
wherein:
the mask assembly comprises:
a mask frame;
a plurality of mask sheets on the mask frame; and
a support frame on the mask frame, a portion of the support frame contacting a lower surface of the mask sheets and supporting the mask sheets; and
the support frame has a thermal expansion coefficient different from a thermal expansion coefficient of the mask sheets.

14. The method of claim 13, wherein the portion of the support frame that contacts the mask sheets is higher than end portions of the support frame.

15. The method of claim 13, wherein the support frame is arranged between adjacent mask sheets.

16. The method of claim 13, wherein a center portion of the support frame contacts a center portion of the mask sheets and supports the mask sheets.

17. The method of claim 13, wherein the support frame has a curved shape.

* * * * *